(12) United States Patent
Yang

(10) Patent No.: US 8,835,103 B2
(45) Date of Patent: Sep. 16, 2014

(54) LITHOGRAPHY PROCESS AND STRUCTURES

(75) Inventor: Chin Cheng Yang, Kaohsiung (TW)

(73) Assignee: Macronix International Co., Ltd. (TW)

( * ) Notice: Subject to any disclaimer, the term of this patent is extended or adjusted under 35 U.S.C. 154(b) by 111 days.

(21) Appl. No.: 13/548,509

(22) Filed: Jul. 13, 2012

(65) Prior Publication Data

US 2014/0017610 A1 Jan. 16, 2014

(51) Int. Cl.
*G03F 7/26* (2006.01)

(52) U.S. Cl.
USPC ............................ 430/325; 430/322; 430/324

(58) Field of Classification Search
USPC .......................................... 430/322, 324, 325
See application file for complete search history.

(56) References Cited

U.S. PATENT DOCUMENTS

| | | | | |
|---|---|---|---|---|
| 7,811,740 | B2 * | 10/2010 | Kanda et al. | 430/270.1 |
| 8,071,272 | B2 * | 12/2011 | Tsubaki | 430/270.1 |
| 2007/0092843 | A1 * | 4/2007 | Yang | 430/322 |
| 2013/0309605 | A1 * | 11/2013 | Jain et al. | 430/270.1 |

* cited by examiner

*Primary Examiner* — Kathleen Duda
(74) *Attorney, Agent, or Firm* — Baker & McKenzie LLP

(57) ABSTRACT

A photo resist layer includes a first region and a second region. A treatment layer is applied to the photo resist layer.

28 Claims, 6 Drawing Sheets

LITHOGRAPHY PROCESS AND STRUCTURES

BACKGROUND

The present application relates generally to semiconductor devices and includes methods and structures for improving lithography.

An important capability for manufacturing reliable integrated circuits is to precisely shape the individual structures that form the integrated circuits. To form the individual structures, a patternable layer such as a photo resist is formed on another layer. The patternable layer is then patterned using a mask, for example by exposing only portions of the photo resist to a light source. The exposure to the light source alters the photo resist such that a selected portion of the photo resist may be removed providing the patterns that will shape the individual structures that will be formed.

FIG. 1A shows a mask that has an assist feature. The mask 10 provides for the main feature 12, which may correspond with a contact hole. An exemplary assist feature is shown as the scattering bars 14. The scattering bars 14 provide for an increased image contrast. In this example, the wider the scattering bars 14 the larger the process window (the window in which the depth of focus of the projected image is acceptable and the pattern size is within a designated specification). However, the more aggressive an assist feature is (i.e., the wider the scattering bars 14), the larger the problem of assist feature print out is. Referring to FIG. 1B, the patterned layer 20 includes the desired patterned features 22 and undesired assist feature print out 22.

It would be desirable to improve the lithography to reduce or eliminate the effect of assist feature print out.

SUMMARY

According to one aspect, a photo resist layer includes a first region and a second region. A treatment layer is applied to the photo resist layer.

DETAILED DESCRIPTION

Figure 1A:
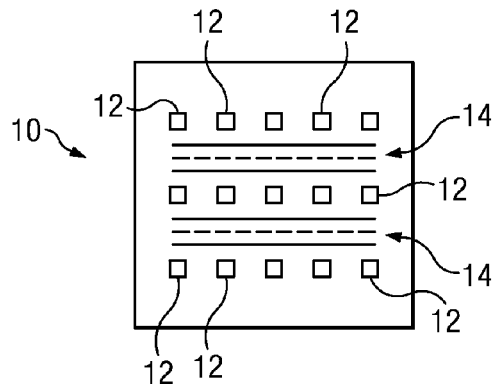
FIG. 1 are a top view of a mask and a patterned layer.
Figure 1B:
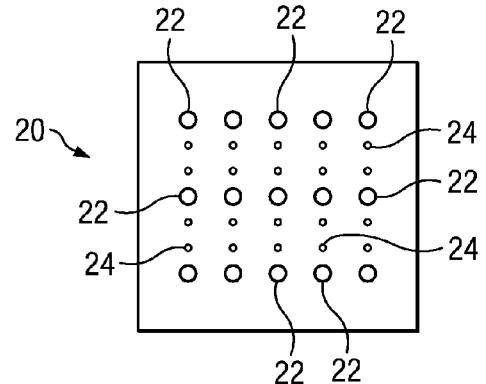
Figure 2A:
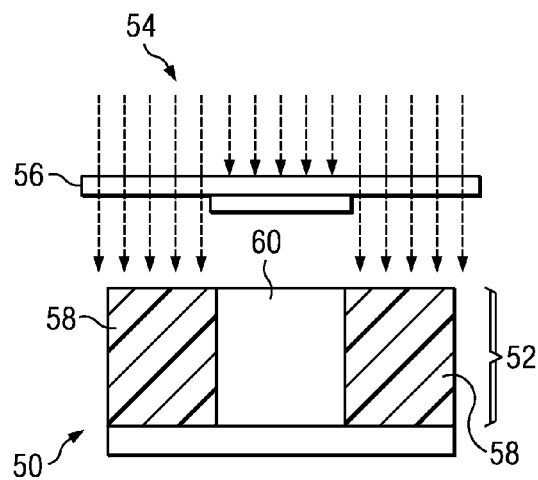
FIG. 2 are cross-sectional views of a lithography process.
Figure 2B:
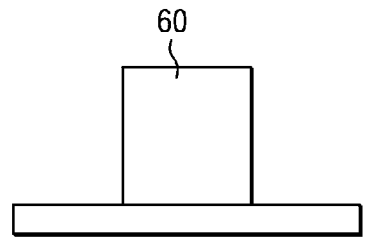
Figure 2C:
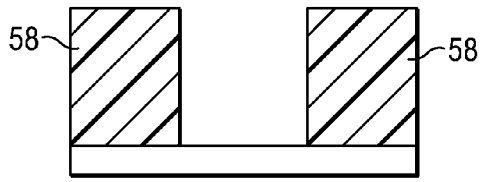

Referring to FIG. 2A, a device 50 includes a photo resist layer 52. The photo resist layer 52 is exposed to a light source 54 that is patterned by a mask 56. Following exposure, the photo resist layer 52 has exposed areas 58 and an unexposed area 60. The exposed photo resist layer 52 can then be treated to obtain a positive tone image (PTI, as shown in FIG. 2B) or a negative tone image (NTI, as shown in FIG. 2C). In a PTI, the photo resist layer 52 is treated with a solution such as 2.38 wt % tetramethylammonium hydroxide (TMAH) in water that removes the exposed areas 58 leaving the unexposed area 60. In a NTI, the photo resist layer 52 is treated with a solution such as an organic solvent like butyl acetate that removes the unexposed area 60 leaving the exposed areas 58.

The choice between NTI and PTI often depends on the feature being patterned in the lithography. For example, NTI may provide better image contrast and be preferred for contact holes and isolation trenches where PTI may be preferred for dense lines.

Figure 3:
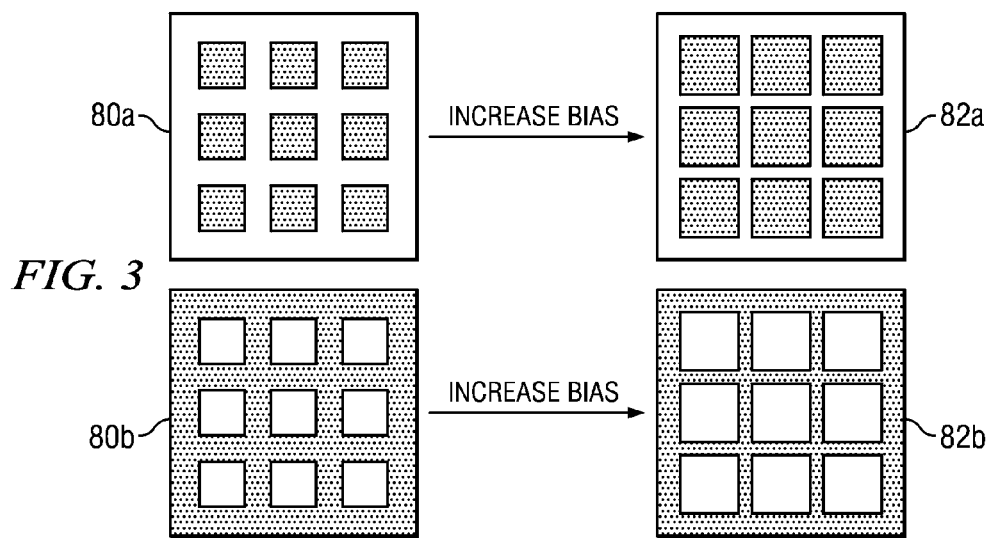
FIG. 3 is top views of masks.

To optimize the patterned image, a mask bias or an assist feature may be used. Referring to FIG. 3, a first NTI mask 80a and a first PTI mask 80b are shown. A second NTI mask 82a and a second PTI mask 82b having an increased mask bias are shown.

FIG. 4 show a lithography process. Referring to FIG. 4A, a semiconductor device 100 includes a base layer 102 and a photo resist layer 104 (note that a layer may also be referred to as a film without loss of generality). The photo resist layer 104 may be applied, for example, by spin coating. The photo resist layer 104 may be a chemical amplify photo resist, an I-line photo resist, a KrF photo resist, a dry ArF photo resist, an immersion ArF photo resist, an extreme ultra violet (EUV) photo resist, etc. The photo resist layer 104 is patterned by a mask 106 illuminated by a light source 108. The mask pattern includes a main feature 110 and assist features 112. The assist features 112 may be of a smaller dimension than the main feature 110. The mask pattern of the mask 106 provides the spatial light intensity 120 shown in FIG. 4B.

Figure 4A:
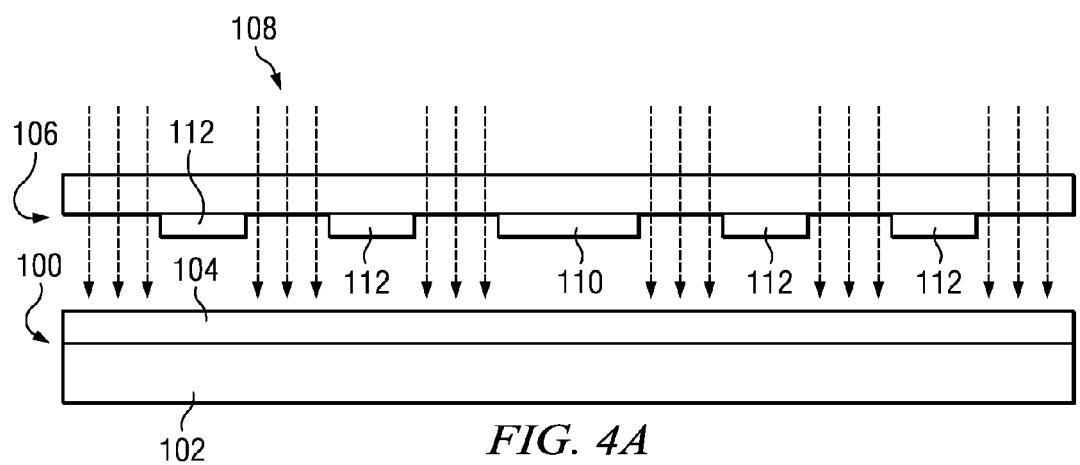
FIG. 4 are cross-sectional views of a lithography process.
Figure 4B:
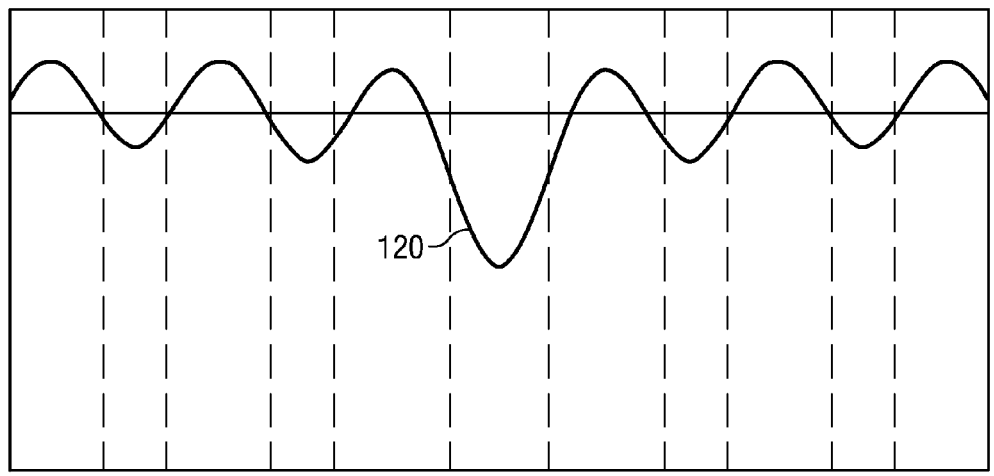
Figure 4C:
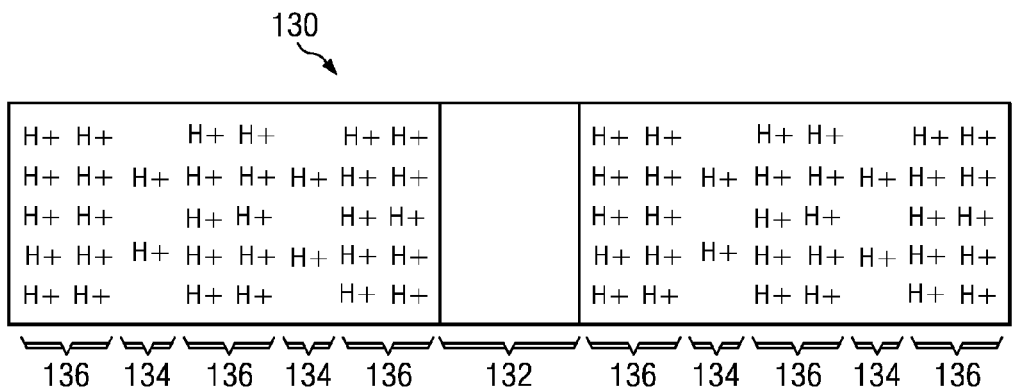

FIG. 4C shows a cross-section of the photo resist layer 130, which corresponds to the photo resist layer 104 after exposure under the mask 106. The photo resist layer 130 has a region 132, which corresponds to the main feature 110 of the mask 106. The region 132 has little to no acid remaining after the exposure. The photo resist layer also has regions 134, which correspond to the assist features 112 of the mask 106. The regions 134 have less acid than the regions 136, which correspond to regions exposed by the mask 106 to the light source (radiated by energy).

Figure 4D:
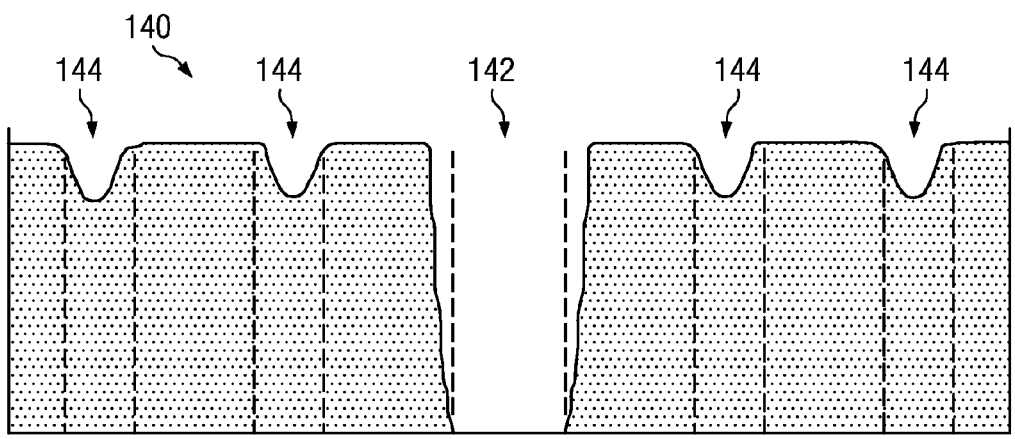

Referring to FIG. 4D, developing the photo resist layer 130 (for example, by performing a post exposure bake and subsequently applying a developer to the photo resist layer 130) forms a layer such as the photo resist layer 140. The photo resist layer 140 includes a feature 142 corresponding with the main feature 110. Also included in the photo resist layer 140 are features 144 corresponding to the assist features 112 of the mask 106. The print out of the features 144 corresponding with the assist features 112 is undesirable.

Figure 4E:
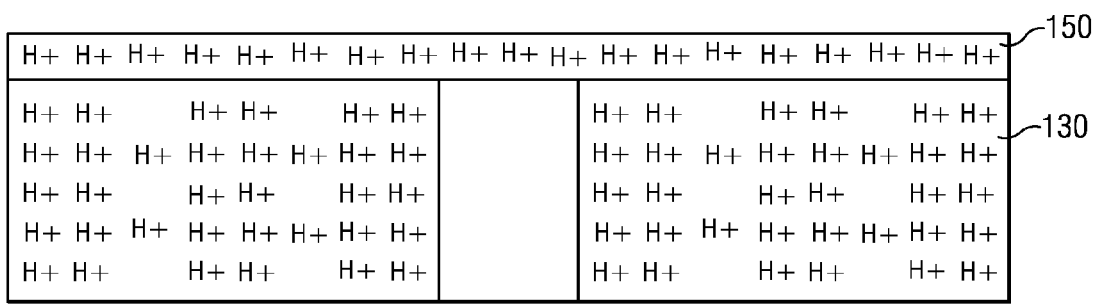
Figure 4F:
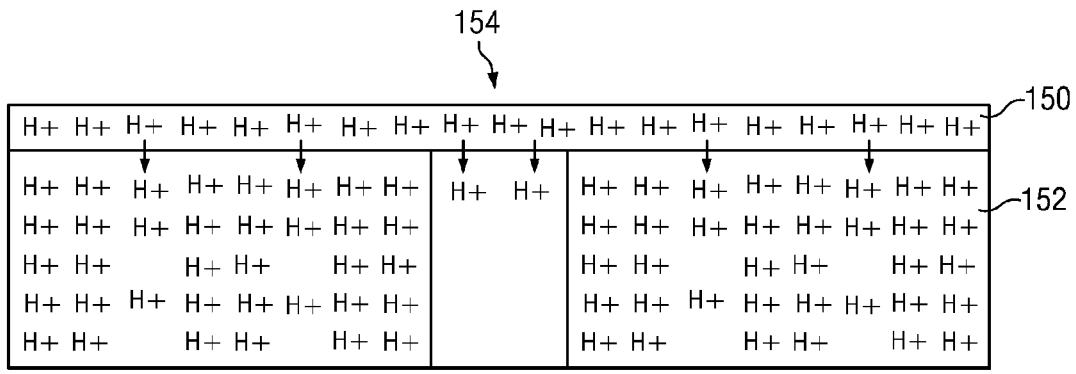

Referring to FIG. 4E, the photo resist layer 130 may be coated with the treatment layer 150. The treatment layer 150 can include a proton concentration tuning material, which acts as a proton donor or a proton acceptor, such as acid or base. The proton concentration tuning material can be used to control the strength of the acid or base. In this embodiment, the treatment layer 150 may be an acid containing film. The acid may be, for example, HF, HCl, $H_2SO_4$, etc. The treatment layer may be formed by a liquid, vapor, or gas agent and may be applied using a variety of methods including spin coating, a puddle process, and a chemical reaction by vapor or gas in a sealed chamber with or without applied heating. As shown in FIG. 4F, acid from the acid containing treatment layer 150 diffuses into the photo resist layer 130 to form the treated photo resist layer 152. The diffusion may be controlled such that enough acid diffuses into the photo resist layer 130 to suppress the print out associated with the assist features 112 of the mask 106 but not so much acid diffuses into the region 154 associated with the main feature 110 of the mask 106 that the formation of the main feature is adversely affected.

To control the diffusion, the strength and concentration of acid in the treatment layer 150 may be selected, the material of the photo resist layer 130 may be selected for its degree of reaction to the acid, and a baking process of a selected temperature and duration may be performed. Particularly in the case of a weaker acid, a bake (either a separate bake or in conjunction with the post exposure bake) increases the diffusion of acid into the photo resist layer 130. A bake is helpful in increasing the diffusion of acid when the gradient between the acidity of the treatment layer 150 and the acidity of the photo resist layer 130 is small. If the gradient is large, the bake may not be needed.

For example, a self limiting process may be used where the acid concentration is selected such that at equilibrium an appropriate amount of acid has diffused into the photo resist layer 130. As another example, the diffusion may be limited in time before the acid is removed. The acid diffuses according a spatial gradient and the diffusion can be stopped when an expected concentration of the acid according to the spatial gradient is expected to have been reached.

Figure 4G:
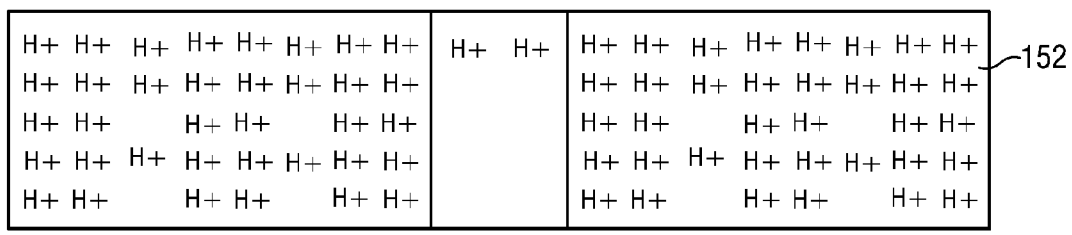

Referring to FIG. 4G, a post exposure bake may be performed followed by the removal of the treatment layer 150 leaving the treated photo resist layer 152.

Figure 4H:
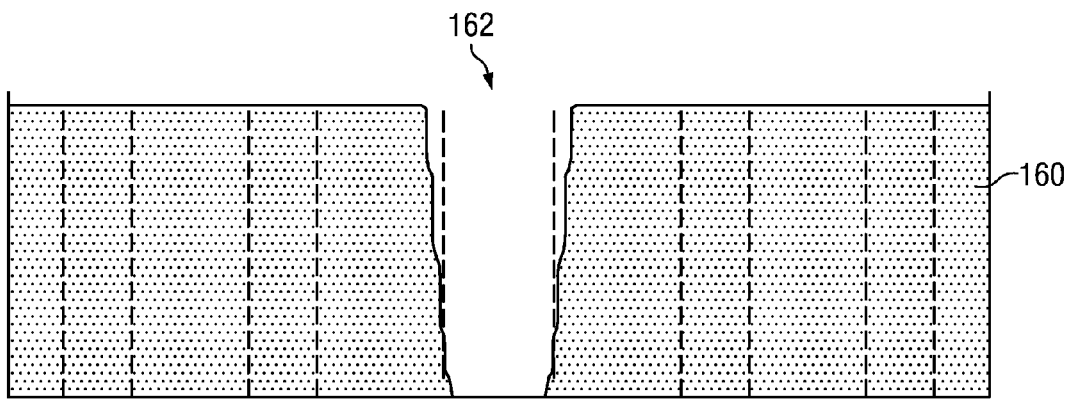

Referring to FIG. 4H, the treated photo resist layer 152 may be developed to provide the photo resist layer 160. The photo resist layer 160 includes a feature 162 corresponding with the main feature 110 and the print out associated with the assist features 112 of the mask 106 has been suppressed or eliminated.

In an example of a treatment by a puddle step, the following steps may be performed in a semiconductor processing track system: (1) a wafer is loaded in a spin unit that dispenses a HF solution and sprays the solution over the photo resist layer, which reacts for a period of 5 sec to 30 sec at a temperature of 22° C.; (2) the HF solution is spun off; (3) water is dispensed to rinse remaining HF solution from the photo resist layer; (4) the wafer is spun dry at a high spin speed; and (5) the spin unit is unloaded. A post exposure bake may be performed.

In another example, a treatment by vapor that may be performed in one or more chambers of a semiconductor processing track (such as a hexamethyldisilazane (HMDS) chamber) includes the steps: (1) a wafer is loaded in a chamber that includes a hot plate inside; (2) the chamber is closed and air in the chamber is vacuumed off; (3) a vapor with some acid is injected and the wafer is loaded on the hot plate, (4) the acid vapor in the chamber is vacuumed off and the wafer is unloaded from chamber; and (5) the wafer is taken to a development step. The treatment layer can be remove at the same time as the development of the photo resist layer.

In step (3), the baking temperature may be the same as the temperature of the post exposure bake, but it may also be different. For example, the temperature may be in the range of 80° C. to 130° C. The baking time may be the same as the baking time of the post exposure bake, but it may also be different. For example, the baking time may be in the range of 30 sec to 120 sec). In some embodiments, the post exposure bake may be skipped.

FIG. 5 show another embodiment of the treatment layer. Referring to FIG. 5A, the photo resist layer 130 may be coated with the treatment layer 180. The treatment layer 180 may be a base containing film, for example containing an amine. The base may be, for example, $NH_3$, $NH_4$, OH, TMAH, HMDS, etc. The treatment layer may be formed by a liquid, vapor, or gas agent and may be applied using a variety of methods including spin coating, a puddle process, and a chemical reaction by vapor or gas in a sealed chamber with or without applied heating. As shown in FIG. 5B, base from the base containing treatment layer 180 reacts with acid in the photo resist layer 130 to form the treated photo resist layer 182.

To control the reaction, the strength and concentration of base in the treatment layer 150 may be selected, the material of the photo resist layer 130 may be selected for its degree of reaction to the base, and a baking process of a selected temperature and duration may be performed. Particularly in the case of a weaker base, a bake (either a separate bake or in conjunction with the post exposure bake) increases the reaction of the base with the acid of the photo resist layer 130. A bake is helpful in increasing the reaction when the gradient between the basicness of the treatment layer 150 and the acidity of the photo resist layer 130 is small. If the gradient is large, the bake may not be needed.

For example, a self limiting process may be used where the base concentration is selected such that at equilibrium an appropriate amount of the base has reacted with the acid of the photo resist layer 30. As another example, the reaction may be limited in time before the base is removed.

Figure 5A:
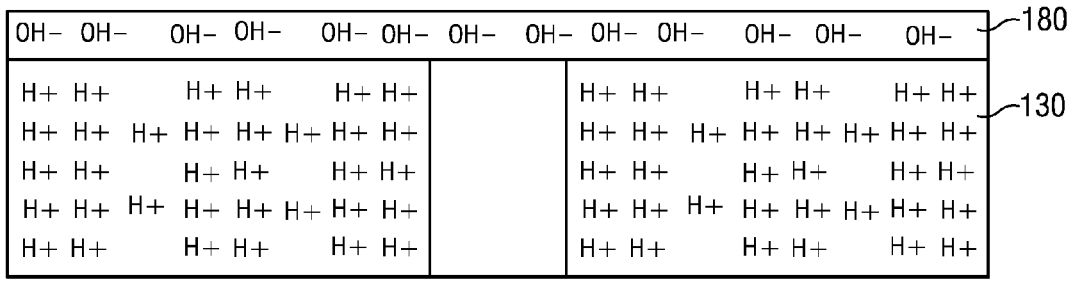
FIG. 5 are cross-sectional views of a lithography process.
Figure 5B:
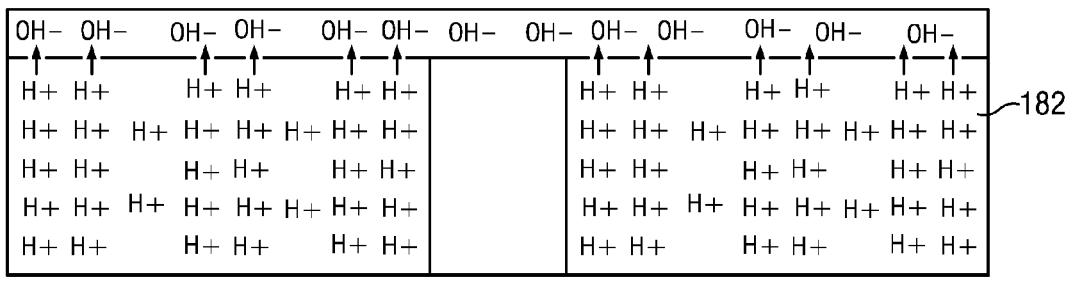
Figure 5C:
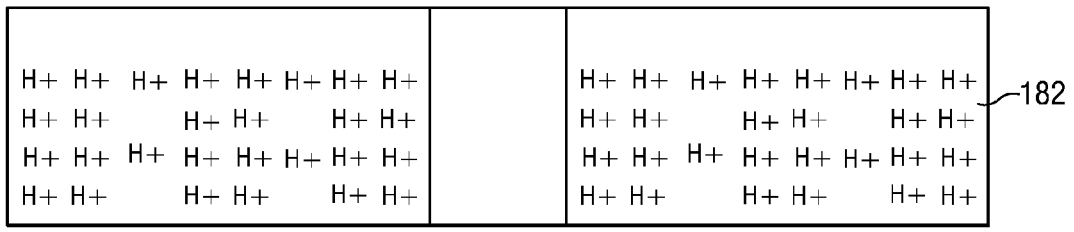

Referring to FIG. 5C, a post exposure bake may be performed followed by the removal of the treatment layer 180 leaving the treated photo resist layer 182.

Figure 5D:
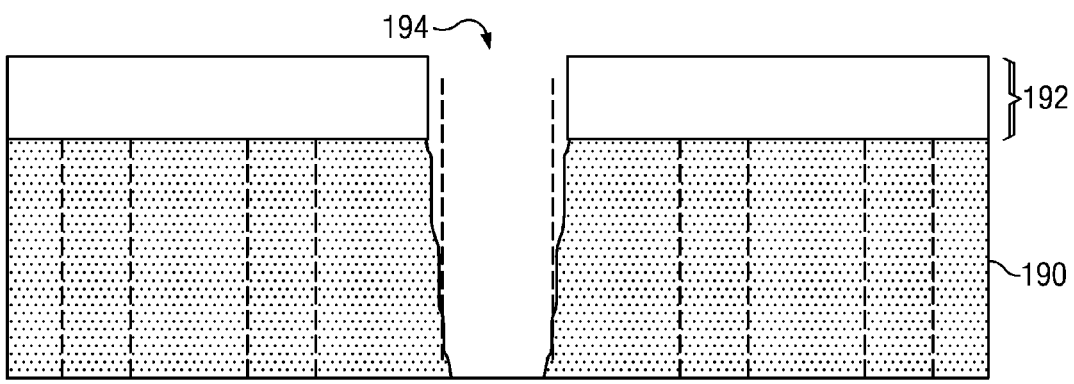

Referring to FIG. 5D, the treated photo resist layer 182 may be developed to provide the photo resist layer 190. An upper portion 192 of the photo resist layer 182 is lost in the treatment process due to the reaction of the acid in the photo resist to the base in the treatment layer. Thus, the thickness of the photo resist layer 190 is less than the thickness of the photo resist layer 130. The photo resist layer 190 includes a feature 192 corresponding with the main feature 110 and the print out associated with the assist features 112 of the mask 106 has been suppressed or eliminated.

Figure 6:
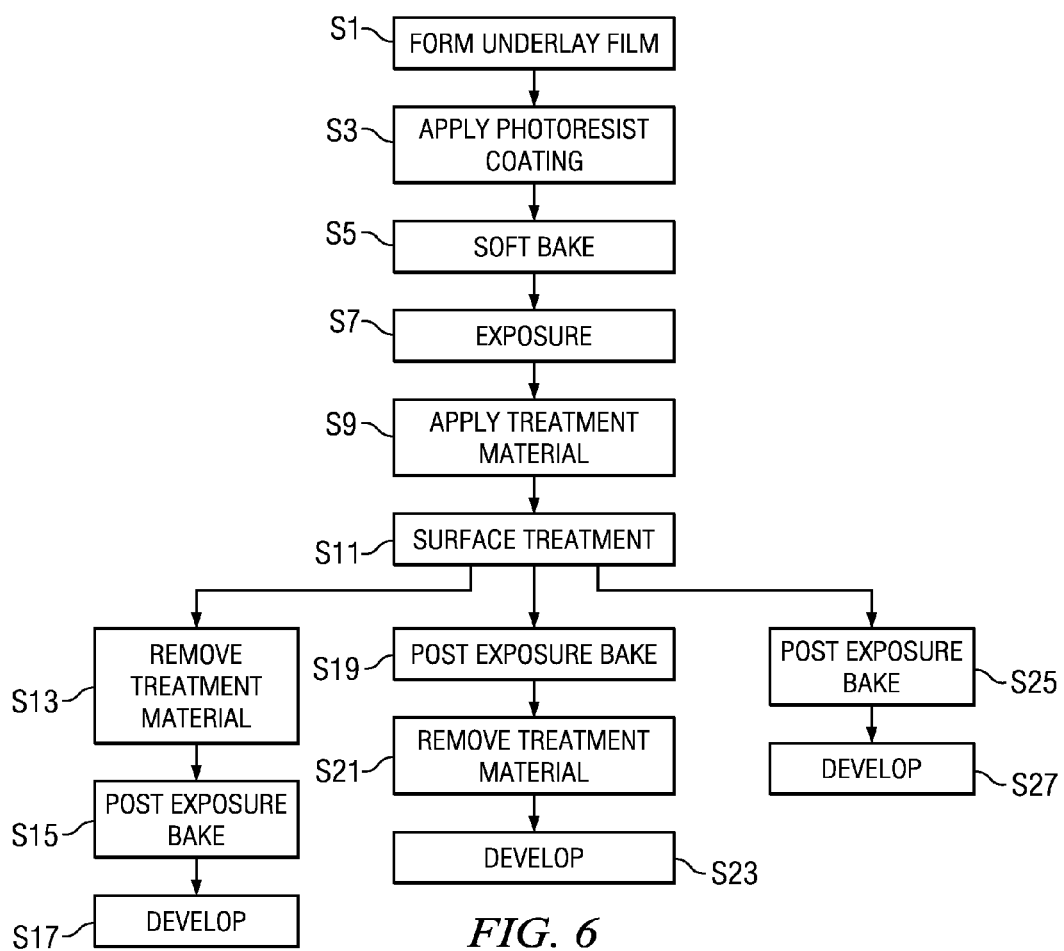
FIG. 6 is a flow diagram of exemplary lithography processes.

The order of the process steps is not limiting and may vary. For example, as shown in FIG. 6, an underlay film is formed at step S1. A photo resist coating is applied as step S3. A soft bake is performed at step S5 and the photo resist is exposed, for example to a light source patterned by a mask, as step S7. In this embodiment, the soft bake is performed in the temperature range of 40-100° C. for a duration of 20-120 seconds. The treatment material is applied at step S9. The surface treatment (for example, the acid diffusion or the base reaction described above) processes at step S11. The treatment material is removed at step S13. A post exposure bake is performed at step S15 and the photo resist is developed (for example by a negative image or positive image developer) at step S17.

In some embodiments, the positive image developer may be a solution such as 2.38 wt % tetramethylammonium hydroxide (TMAH). The negative image developer may be a solution such as an organic solvent like butyl acetate.

The choice between NTI and PTI often depends on the feature being patterned in the lithography. For example, NTI may provide better image contrast and be preferred for contact holes and isolation trenches where PTI may be preferred for dense lines.

As another example, after the surface treatment at step S11, the post exposure bake is performed at step S19. Then, the treatment material is removed at a step S21 and the photo resist is developed at a step S23.

As still another example, after the surface treatment at step S11, the post exposure bake is performed at step S25. Then, the photo resist is developed at a step S27 in which the treatment material is removed at the same time.

The above-described surface treatment processes and structures allow for the exemplary benefit that a process window can be improved through the use of a larger more aggressive assist feature while reducing or eliminating the print out of the assist feature. Thus, the contrast ratio of the lithography process can be improved.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A method, comprising:
   forming a photo resist layer having a first region and a second region;
   exposing the photo resist layer with a mask; and
   applying a treatment layer to the photo resist layer,
   wherein the second region contains substantially no photo acid after exposure, and
   wherein the second region forms a feature.

2. The method of claim 1, wherein the mask includes a first feature and a second feature.

3. The method of claim 2, wherein a dimension of the second feature is smaller than a dimension of the first feature.

4. The method of claim 2, wherein the first feature included in the mask corresponds with the feature formed in the second region of the photo resist.

5. The method of claim 1, wherein the treatment layer includes proton concentration tuning materials.

6. The method of claim 1, wherein the first region is a region that is radiated by energy.

7. The method of claim 1, wherein the second region is a region that is not radiated by energy.

8. The method of claim 1, further comprising:
   patterning the photo resist layer with the mask, the mask including a main feature and an assist feature, and the assist feature being provided to improve the patterning of the main feature, wherein
   the treatment layer reduces the effect of the assist feature on the photo resist layer.

9. The method of claim 8, wherein the patterning the photo resist layer is patterning a negative tone image.

10. The method of claim 9, wherein the patterned photo resist layer is developed in a solution including an organic solvent.

11. The method of claim 10, wherein the solution includes butyl acetate.

12. The method of claim 9, wherein the main feature corresponds with a contact hole or isolation trench.

13. The method of claim 8, wherein the main feature included in the mask corresponds with the feature formed in the second region of the photo resist.

14. The method of claim 1, further comprising removing the treatment layer.

15. The method of claim 14, further comprising baking the photo resist layer and the treatment layer before the treatment layer is removed.

16. The method of claim 14, further comprising baking the photo resist layer after the treatment layer is removed.

17. The method of claim 14, further comprising developing the photo resist layer before the treatment layer is removed.

18. The method of claim 1, further comprising developing the photo resist layer, the developing being performed in the presence of the treatment layer and the developing removing the treatment layer and unpatterned portions of the photo resist layer.

19. The method of claim 1, wherein the treatment layer includes an acid.

20. The method of claim 19, wherein the acid is one or more of: HF, HCl or H2SO4.

21. The method of claim 1, wherein the treatment layer includes a base.

22. The method of claim 21, wherein the base is an amine.

23. The method of claim 21, wherein the base includes one or more of: $NH_3$, $NH_4^+$, $OH^-$, tetramethylammonium hydroxide, or hexamethyldisilazane.

24. The method of claim 1, further comprising developing the photo resist layer, the developing including applying an organic solvent to the photo resist layer.

25. The method of claim 1, further comprising developing the photo resist layer, the developing including applying tetramethylammonium hydroxide to the photo resist layer.

26. The method of claim 1, wherein the photo resist layer includes a photo resist selected from the group consisting of a chemically amplified photo resist, an I-line photo resist, a KrF photo resist, an ArF photo resist, and an extreme ultra violet photo resist.

27. The method of claim 1, wherein the photo resist layer comprises an ArF photo resist that is operable to be processed by a dry technique.

28. The method of claim 1, wherein the photo resist layer comprises an ArF photo resist that is operable to be processed by an immersion technique.

* * * * *